United States Patent
Craig et al.

(12) 
(10) Patent No.: US 6,194,974 B1
(45) Date of Patent: Feb. 27, 2001

(54) MULTI-BAND VOLTAGE CONTROLLED OSCILLATOR IN WHICH UNNECESSARY CIRCUIT PARASITICS CAN BE AVOIDED

(75) Inventors: Allen Craig, Berkshire (GB); Olaf Rostbakken, Blystadia (NO)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/359,743

(22) Filed: Jul. 23, 1999

(30) Foreign Application Priority Data

Jul. 24, 1998 (GB) .................................................. 9816060

(51) Int. Cl.$^7$ ..................................................... H03B 5/00
(52) U.S. Cl. ......................................... 331/117 R; 331/179
(58) Field of Search ........................... 331/117 R, 177 V, 331/107 SL, 108 C, 179

(56) References Cited

U.S. PATENT DOCUMENTS

| | | | |
|---|---|---|---|
| 4,494,081 | * | 1/1985 | Lea et al. ............................. 331/36 C |
| 4,593,255 | * | 6/1986 | Matsuura ........................... 331/117 R |
| 5,144,264 | * | 9/1992 | Chong et al. ...................... 331/117 R |
| 5,231,361 | * | 7/1993 | Smith et al. ............................. 331/56 |
| 5,739,730 | | 4/1998 | Rotzoll .................................. 331/177 |
| 5,982,243 | * | 11/1999 | Pope ....................................... 331/59 |

* cited by examiner

*Primary Examiner*—Benny Lee
*Assistant Examiner*—Henry Choe
(74) *Attorney, Agent, or Firm*—Sughrue, Mion, Zinn, Macpeak & Seas, PLLC

(57) ABSTRACT

In a voltage controlled oscillator in which an operation frequency is determined by applying a tuning voltage to a resonant circuit connected to a control terminal of a transistor (T1), the resonant circuit has zeroth and first varactor diodes (D0, D1) which can serve as capacitance elements. A selection voltage is applied to an anode of the first varactor diode through a band selection terminal (1). The first vatactor diode has a capacitance varying in response to the value of the selection voltage. The variation of the capacitance causes a change of a frequency band of the voltage controlled oscillator. A tuning voltage is applied through a tuning terminal (2).

23 Claims, 1 Drawing Sheet

MULTI-BAND VOLTAGE CONTROLLED OSCILLATOR IN WHICH UNNECESSARY CIRCUIT PARASITICS CAN BE AVOIDED

BACKGROUND OF THE INVENTION

This invention relates to a voltage controlled oscillator and, in particular, to a voltage controlled oscillator operable over a wide range of frequencies.

A band switching voltage controlled oscillator is described in U.S. Pat. No. 5,739,730 given to Rotzoll. The band switching of Rotzoll relies on diodes such as varactor diodes being added selectively to a tuning circuit by switches.

In the above-mentioned voltage controlled oscillator, switching is carried out of the components in and out of the tuning circuit operating at radio frequency. This results in the introduction of unwelcome circuit parasitics. Also in applications for which it is important to minimize equipment volume and the number of components used, improvements over the prior art are necessary.

SUMMARY OF THE INVENTION

It is an object of this invention to provide a voltage controlled oscillator of smaller volume and with fewer components, capable of operating within a number of different frequency bands.

It is another object of this invention to avoid the unnecessary circuit parasitics introduced by band switching in the radio frequency circuit.

According to this invention, there is provided voltage controlled oscillator which comprising a valve control element having a control terminal, a resonance circuit having an inductance element connected to the control terminal, and a tuning terminal for applying a tuning voltage to the resonance circuit. In the voltage controlled oscillator, the resonance circuit comprises a first band selection terminal to be applied with a selection voltage for selecting a frequency band, a zeroth varactor diode having a cathode connected to the inductance element, and a first varactor diode having an anode connected to the first band selection terminal and a cathode connected to the inductance element.

According to this invention, there is also provided a voltage controlled oscillator comprising an active circuit including a transistor or the like and a tuning circuit. The tuning circuit has inductance and capacitance comprising a plurality of varactor diodes in parallel. At least one of the varactor diodes remains in the high capacitance, "on" state. Further varactor diodes remain in circuit and are changed selectively from a high capacitance "on" state to a low capacitance "off" state to alter the frequency tuning range of the voltage controlled oscillator.

DESCRIPTION OF THE PREFERRED EMBODIMENTS

Figure 1:
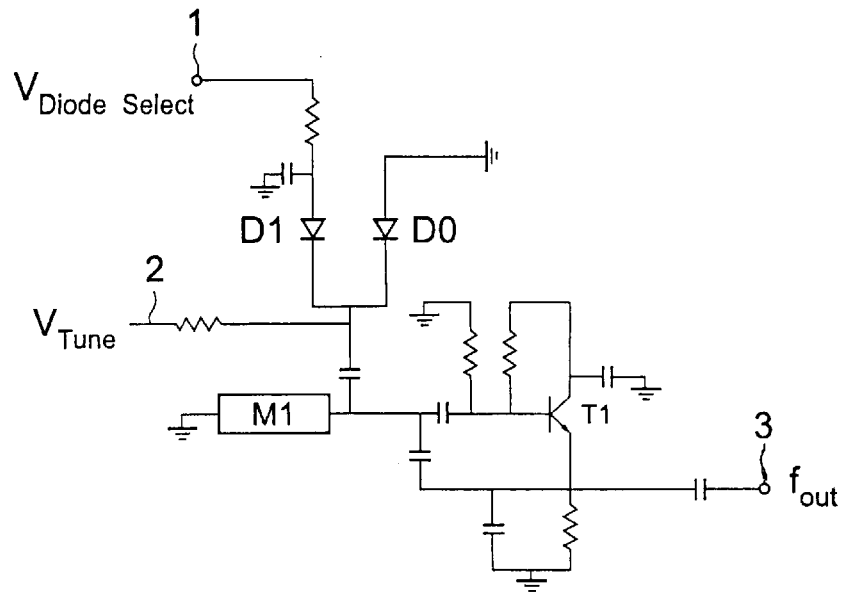
FIG. 1 is a circuit diagram of a voltage controlled oscillator according to a first embodiment of this invention.

With reference to FIG. 1, description will be made as regards a voltage controlled oscillator according to a first embodiment of this invention.

The voltage controlled oscillator is suitable for use with a so-called "dual band" mobile phone. In the dual band mobile phone, the voltage controlled oscillator is required to operate in two different frequency bands, one band centered around 1200 MHz and another band centered around 1550 MHz.

The voltage controlled oscillator is based upon a negative resistance oscillator. The voltage controlled oscillator comprises a transistor T1 as a valve control element, a microstrip line M1 as an inductance element connected to a control terminal of the transistor T1, zeroth and first varactor diodes D0 and D1 as capacitance elements arranged in parallel to each other with their cathodes connected to the control terminal of the transistor T1, a band selection terminal 1 connected to an anode of the first varactor diode D1, and a tuning terminal 2 connected to the cathodes of the zeroth and the first varactor diodes D0 and D1. A combination of the microstrip line M1 and the zeroth and the first varactor diodes D0 and D1 is referred to as a resonant circuit of the voltage controlled oscillator.

The gain of the voltage controlled oscillator is derived from the transistor T1. The shorted microstrip line M1 provides a high Q and is easily fabricated.

In order to select a frequency band, a selection voltage $V_{Diode\ Select}$ is applied to the band selection terminal 1. When the lower frequency band is to be selected, the selection voltage $V_{Diode\ Select}$ applied to the band selection terminal 1 is set to 0V. The selection voltage $V_{Diode\ Select}$ is applied to the band selection terminal 1 by an external logical circuit (not shown). The external logical circuit does not form a part of the voltage controlled oscillator by is a baseband control circuit of, for example, the telephone in which the voltage controlled oscillator is used.

The operation frequency within the lower frequency band is determined by a tuning voltage $V_{Tune}$ applied from a synthesizer (not shown) to the tuning terminal 2. The voltage determined by the tuning voltage $V_{Tune}$ is applied to the cathodes of the zeroth and the first varactor diodes D0 and D1. Therefore, a variation of the tuning voltage $V_{Tune}$ causes a change in the capacitance of the zeroth and the first varactor diodes D0 and D1. This results in a change of the operation frequency of the resonant circuit. Thus, an output frequency $f_{out}$ at an output terminal 3 varies in accordance with the value of the tuning voltage $V_{Tune}$ applied to the tuning terminal 2.

When the lower frequency band is selected, i.e., the selection voltage $V_{Diode\ Select}$ of 0V is applied to the band selection terminal 1, the zeroth varactor diode D0 remains in the high capacitance "on" state. The capacitance range of the zeroth varactor diode D0 is very much smaller than that of the first varactor diode D1. However, the zeroth varactor diodes D0 have little effect on the operation frequency of the circuit in this configuration.

When the higher frequency band is to be selected, the selection voltage $V_{Diode\ Select}$ applied to the band selection terminal 1 is set at -12V. The selection voltage $V_{Diode}$ Select is applied to the anode of the first varactor diode D1. Thus, the first varactor diode D1 is switched into a low capacitance "off" state.

The operation frequency in the higher frequency band is also determined by the tuning voltage $V_{Tune}$ applied to the tuning terminal 2. Specifically, the operation frequency in the higher frequency band is effectively determined by the voltage applied to the cathode of the zeroth varactor diode D0 in dependence upon the value of the tuning voltage $V_{Tune}$ at the tuning terminal 2. The relatively small capacitance of the first varactor diode D1 which is parallel with the zeroth varactor diode D0 and is kept at low capacitance "off" state within the circuit has little effect on the operation frequency of the circuit.

Generation of the negative selection voltage $V_{Diode\ Select}$ is relatively simple because of the very low current requirements of the varactor diodes. Therefore, the voltage controlled oscillator is suitable for applications where power supply limitations exist such as battery powered mobile phones.

The voltage controlled oscillator shown in FIG. 1 may be extended to a so-called "multi-band" voltage controlled oscillator. A voltage controlled oscillator capable of operation in more than two frequency bands can be included in a multi-band mobile phone.

Figure 2:
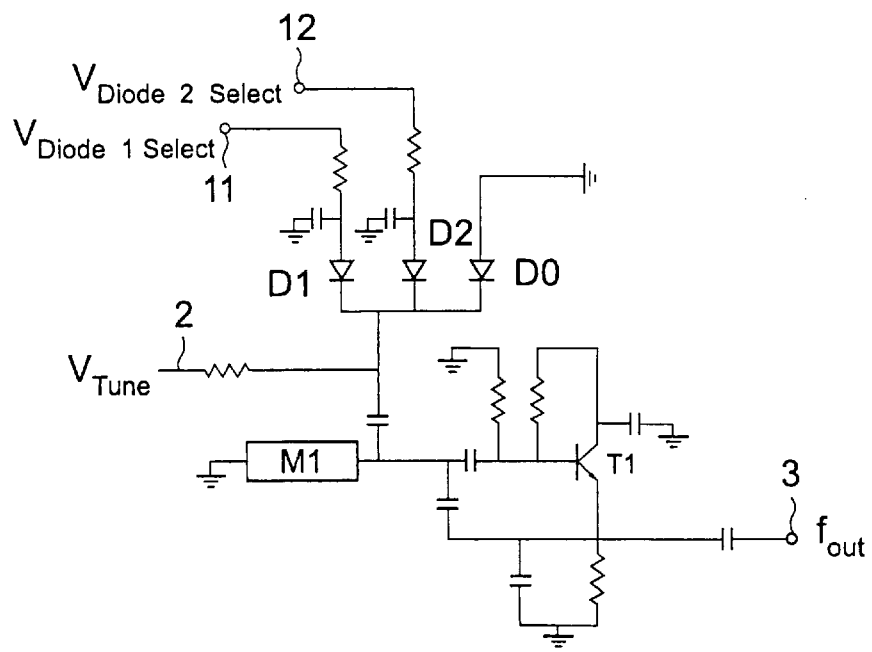
FIG. 2 is a circuit diagram of a voltage controlled oscillator according to a second embodiment of this invention.

Next referring to FIG. 2, description will be made as regards a voltage controlled oscillator according to a second embodiment of this invention. The voltage controlled oscillator shown in FIG. 2 is suitable for use with a triple-band mobile phone. The similar parts are designated by like reference numerals as in FIG. 1 and will not be described any longer.

The voltage controlled oscillator is also based upon a negative resistance oscillator. In addition to the zeroth and the first varactor diodes D0 and D1, the voltage controlled oscillator includes a second varactor diode D2 which is parallel to the varactor diodes D0 and D1. In order to select the frequency band, selection voltages $V_{Diode\ 1\ Select}$ and $V_{Diode\ 2\ Select}$ are applied to the first and second band selection terminals 11 and 12 from the external logical circuit, respectively.

The capacitance provided by these varactor diodes D0, D1, and D2 is selectable. In other words, the required output frequency band can be selected by applying a negative voltage (for example, −12V) to the anodes of the varactor diodes that are not required for the selected frequency band. The varactor diodes with a negative voltage applied to their anodes remain in circuit in a low capacitance "off" state. The other varactor diode remains in circuit in its high capacitance "on" state. The parasitic resistance of the varactor diodes is lowest in the low capacitance "off" state. Thus, a high circuit Q circuit can be maintained.

Switching of the varactor diodes to the low capacitance "off" state is carried out by applying a large negative voltage to the first and the second band selection terminals 11 and 12 as the selection voltages $V_{Diode\ 1\ Select}$ and $V_{Diode\ 2\ Select}$. The in-band tuning voltage $V_{Tune}$ is generally applied to the tuning terminal 2 from the synthesizer. The tuning voltage $V_{Tune}$ is applied to the commonly connected cathodes of the varactor diodes.

All of the varactor diodes in the "off" state have a very small capacitance variation with voltage. Therefore, the effect of the "off" state varactor diodes on the resonant circuit is very small.

While the present invention has thus far been described in connection with a few embodiments thereof, it will readily be possible for those skilled in the art to put this invention into practice in various other manners. For example, it will readily be understood that a multi-band voltage controlled oscillator is achieved by adding another varactor diode or diodes in parallel.

What is claimed is:

1. A voltage controlled oscillator comprising:
   a valve control element having a control terminal;
   a resonance circuit having an inductance element connected to said control terminal; and
   a tuning terminal for applying a tuning voltage to said resonance circuit, said resonance circuit comprising:
   a first band selection terminal to be applied with a selection voltage for selecting a frequency band;
   a zeroth varactor diode having a cathode connected to said inductance element; and
   a first varactor diode having an anode connected to said first band selection terminal and a cathode connected to said inductance element,
   wherein said tuning terminal is connected between said inductance element and at least one of said zeroth and first varactor diodes.

2. A voltage controlled oscillator as claimed in claim 1, wherein at least one of said zeroth and said first varactor diodes acts as a capacitance element for said resonance circuit.

3. A voltage controlled oscillator as claimed in claim 1, wherein said tuning terminal is connected between said inductance element and each of said zeroth and said first varactor diodes.

4. A voltage controlled oscillator as claimed in any of claims 1, wherein said resonance circuit further comprises:
   a second band selection terminal to be applied with a selection voltage for selecting a frequency band; and
   a second varactor diode having an anode connected to said second band selection terminal and a cathode connected to said inductance element.

5. A voltage controlled oscillator as claimed in claim 4, wherein at least one of said zeroth, said first, and said second varactor diodes acts as a capacitance element for said resonance circuit.

6. A voltage controlled oscillator as claimed in claim 1, wherein said valve control element is a transistor.

7. A voltage controlled oscillator comprising an active circuit including a transistor and a tuning circuit, said tuning circuit having inductance and capacitance comprising a plurality of varactor diodes in parallel, at least one of said varactor diodes remaining in the high capacitance, "on" state and further varactor diodes remaining in circuit and being changed selectively from a high capacitance "on" state to a low capacitance "off" state to alter the frequency tuning range of said voltage controlled oscillator.

8. A voltage controlled oscillator as claimed in claim 7, wherein each of said further varactor diodes is changed selectively from a high capacitance "on" state to a low capacitance "off" state by the application of a negative anode voltage.

9. A voltage controlled oscillator as claimed in claim 8, wherein the application of said negative anode voltage is carried out by an external logic circuit.

10. A voltage controlled oscillator as claimed in claim 7, wherein said at least one and said further varactor diodes have commonly connected cathode to which the in-band tuning voltage is applied.

11. A voltage controlled oscillator as claimed in claim 7, wherein said inductance is a shorted microstrip line.

12. A voltage controlled oscillator, comprising:
   a control element having a control terminal;
   a resonance circuit coupled to said control terminal, wherein said resonance circuit comprises a first capacitance element and a second capacitance element;
   a tuning terminal that supplies a tuning voltage to said resonance circuit; and
   a selection terminal that supplies a selection voltage to said resonance circuit;
   wherein said first capacitance element maintains an "on" state while said second capacitance element is selectively placed in the "on" state and an "off" state based on said selection voltage.

13. The voltage controlled oscillator as claimed in claim 12, wherein said first and second capacitance elements comprise first and second varactor diodes, respectively.

14. The voltage controlled oscillator as claimed in claim 12, wherein an anode of said second capacitance element is coupled to said selection terminal and a cathode of said second capacitance element is coupled to said tuning terminal.

15. The voltage controlled oscillator as claimed in claim 14, wherein said resonance circuit further comprises an inductance element that has a first terminal coupled to said tuning terminal.

16. The voltage controlled oscillator as claimed in claim 14, wherein a cathode of said first capacitance element is coupled to said tuning terminal.

17. The voltage controlled oscillator as claimed in claim 16, wherein an anode of said second capacitance element does not directly or indirectly receive said selection voltage from said selection terminal.

18. The voltage controlled oscillator as claimed in claim 15, wherein a cathode of said first capacitance element is coupled to said tuning terminal and an anode of said first capacitance element does not directly or indirectly receive said selection voltage from said selection terminal.

19. The voltage controlled oscillator as claimed in claim 18, wherein a second terminal of said inductance element is coupled to a predetermined voltage.

20. The voltage controlled oscillator as claimed in claim 19, wherein said anode of said first capacitance element is coupled to said predetermined voltage.

21. The voltage controlled oscillator as claimed in claim 12, further comprising a second selection terminal that supplies a second selection voltage to said resonance circuit, wherein said resonance circuit further comprises a third capacitance element that is selectively placed in the "on" state and the "off" state based on said second selection voltage.

22. The voltage controlled oscillator as claimed in claim 21, wherein an anode of said second capacitance element is coupled to said selection terminal and a cathode of said second capacitance element is coupled to said tuning terminal, and wherein an anode of said third capacitance element is coupled to said second selection terminal and a cathode of said third capacitance element is coupled to said tuning terminal.

23. The voltage controlled oscillator as claimed in claim 22, wherein said resonance circuit further comprises an inductance element, wherein said tuning terminal is coupled between said inductance element and said resonance circuit, and wherein said inductance element is coupled to said control terminal.

* * * * *

UNITED STATES PATENT AND TRADEMARK OFFICE
CERTIFICATE OF CORRECTION

PATENT NO. : 6,194,974 B1
DATED : February 27, 2001
INVENTOR(S) : Allen Craig, Olaf Rostbakken It is certified that error appears in the above-identified patent and that said Letters Patent is hereby corrected as shown below:

Title page,
In the Priority delete "9816060" insert -- 9816060.9 --.

Signed and Sealed this

Twenty-ninth Day of January, 2002

Attest:

Attesting Officer

JAMES E. ROGAN
Director of the United States Patent and Trademark Office